(12) United States Patent
Wang et al.

(10) Patent No.: US 8,908,424 B2
(45) Date of Patent: Dec. 9, 2014

(54) MAGNETIZATION SWITCHING THROUGH MAGNONIC SPIN TRANSFER TORQUE

(71) Applicants: Xiangrong Wang, Kowloon (CN); Peng Yan, Delft (NL); Xiansi Wang, Kowloon (CN)

(72) Inventors: Xiangrong Wang, Kowloon (CN); Peng Yan, Delft (NL); Xiansi Wang, Kowloon (CN)

(73) Assignee: The Hong Kong University of Science and Technology, Kowloon (HK)

( * ) Notice: Subject to any disclaimer, the term of this patent is extended or adjusted under 35 U.S.C. 154(b) by 104 days.

(21) Appl. No.: 13/630,060

(22) Filed: Sep. 28, 2012

(65) Prior Publication Data

US 2013/0082798 A1    Apr. 4, 2013

Related U.S. Application Data

(60) Provisional application No. 61/626,768, filed on Oct. 3, 2011.

(51) Int. Cl.
| | | |
|---|---|---|
| *G11C 11/00* | (2006.01) | |
| *G11C 11/14* | (2006.01) | |
| *H01L 29/82* | (2006.01) | |
| *H01L 29/66* | (2006.01) | |
| *G11B 5/66* | (2006.01) | |
| *G11B 5/02* | (2006.01) | |
| *G11B 5/00* | (2006.01) | |

(52) U.S. Cl.
CPC .......... *H01L 29/66984* (2013.01); *H01L 29/82* (2013.01); *G11B 5/66* (2013.01); *G11B 5/02* (2013.01); *G11B 2005/0002* (2013.01)
USPC ............................ 365/158; 365/171; 257/421

(58) Field of Classification Search
USPC ......................................................... 365/158
See application file for complete search history.

(56) References Cited

U.S. PATENT DOCUMENTS

| | | | |
|---|---|---|---|
| 7,450,327 B2 * | 11/2008 | Yang et al. ...................... | 360/31 |
| 7,710,757 B2 | 5/2010 | Kim et al. | |
| 7,719,070 B2 | 5/2010 | Hall et al. | |
| 7,864,556 B2 | 1/2011 | Lim et al. | |
| 7,969,762 B2 * | 6/2011 | Cros et al. ...................... | 365/80 |
| 8,004,882 B2 | 8/2011 | Katti et al. | |
| 8,064,244 B2 | 11/2011 | Zhang et al. | |

(Continued)

OTHER PUBLICATIONS

Zhang et al., "Roles of Nonequilibrium Conduction Electrons on the Magnetization Dynamics of Ferromagnets", published Sep. 17, 2004, vol. 93, No. 12, Department of Physics and Astronomy, University of Missouri-Columbia, Columbia, Missouri 65211, USA Phys. Rev. Lett. , 93, 127204.

(Continued)

*Primary Examiner* — Son Mai
(74) *Attorney, Agent, or Firm* — Amin, Turocy & Watson, LLP

(57) ABSTRACT

The subject application describes systems and methods that drive magnetization switching through magnonic spin transfer torque. A spin current is provided to a first magnetic layer with a first magnetic state. The spin current facilitates magnetization switching via a magnonic spin transfer torque in a second magnetic layer with a second magnetic state that is separated from the first magnetic layer by an interface. Alternatively, a spin current is provided to a first magnetic domain with a first magnetic state. The spin current facilitates domain wall propagation via a magnonic spin transfer torque. The domain wall is between the first magnetic domain and a second magnetic domain in a second magnetic state.

13 Claims, 8 Drawing Sheets

(56) References Cited

U.S. PATENT DOCUMENTS

| 8,064,246 B2 * | 11/2011 | Slonczewski | 365/158 |
| 8,456,894 B2 * | 6/2013 | Abraham et al. | 365/158 |
| 8,754,491 B2 * | 6/2014 | Abraham et al. | 257/421 |
| 2014/0003119 A1 * | 1/2014 | Annunziata et al. | 365/80 |

OTHER PUBLICATIONS

Han et al., "Magnetic domain-wall motion by propagating spin waves", Appl. Phys. Lett. 94, 112502 (Mar. 17, 2009).

Hinzke et al., "Domain Wall Motion by the Magnonic Spin Seebeck Effect", Physical Review Letters 107, 027205 (Jul. 8, 2011).

Seo et al., "Magnetic vortex wall motion driven by spin waves", Appl. Phys. Lett. 98, 012514 (Jan. 7, 2011).

Jamali et al., "Spin wave assisted current induced magnetic domain wall motion", Appl. Phys. Lett. 96, Issue 24, 242501 (Jun. 2010).

John Slonczewski, "Initiation of spin-transfer torque by thermal transport from magnons", Phys.Rew. B 82, 054403 (Aug. 3, 2010).

Macke et al., "Transmission and reflection of spin waves in the presence of Neel walls", Journal of Physics: Conference Series 200 (2010) 042015.

Yuan et al., "Quantum Dynamics of Spin Wave Propagation Through Domain Walls", Journal of the Physical Society of Japan, vol. 75 No. 8, Aug. 2006, 084703.

Yan et al., "Domain wall propagation due to the synchronization with circularly polarized microwaves" Physical Review B 80, 214426 (Dec. 30, 2009).

* cited by examiner

MAGNETIZATION SWITCHING THROUGH MAGNONIC SPIN TRANSFER TORQUE

CROSS REFERENCE TO RELATED APPLICATION

This application claims priority to U.S. provisional application No. 61/626,768, entitled: "MAGNONIC SPIN TRANSFER TORQUE BASED SPINTRONIC DEVICE," and filed on Oct. 3, 2011.

TECHNICAL FIELD

This disclosure generally relates to magnetization switching driven by magnonic spin transfer torque.

BACKGROUND

Magnetic domain wall propagation along nanowires has achieved recent attention due to its potential applications. One such application is magnetic data storage in nanosized devices. Magnetic data storage devices facilitate data writing and erasing on a magnetized medium through manipulation of magnetization patterns. Magnetization switching (also known as magnetization reversal) is a process that facilitates reorientation of a magnetic field vector (or magnetization vector) by 180 degrees with respect to an initial direction of the magnetic field vector to manipulate the magnetization pattern.

A magnetic domain wall can propagate in a nanowire (1) upon exposure to an external magnetic field including a microwave due to energy dissipation and/or (2) based on a spin-polarized electric current due to spin transfer torque.

Static magnetic fields are impractical to achieve magnetic domain wall propagation in nanowires. As size decreases, shape anisotropy increases, and a magnetic field with an increased magnitude is required to accomplish magnetization switching. In data storage applications, the increased magnitude magnetic field requirement can limit the density of data storage devices.

Magnetic domain wall propagation through electron spin current spin transfer torque is also impractical for data storage applications. While electron spin current spin transfer torque does not require a large magnitude magnetic field, electron spin current spin transfer torque does require a high critical current density. The high critical current density creates Joule heating, which can be a bottleneck to magnetization switching applications.

The above-described background is merely intended to provide an overview of contextual information regarding manipulation of magnetization, and is not intended to be exhaustive. Additional context may become apparent upon review of one or more of the various non-limiting embodiments of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate any scope of particular embodiments of the specification, or any scope of the claims. Its sole purpose is to present some concepts of the specification in a simplified form as a prelude to the more detailed description that is presented later.

In accordance with one or more embodiments and corresponding disclosure, various non-limiting aspects are described in connection with achieving magnetization switching according to magnonic spin transfer torque. In an embodiment, a system is described that can utilize magnonic spin transfer torque to facilitate magnetization switching. The system includes a first magnetic layer in a first magnetic state and a second magnetic layer in a second magnetic state, separated by a metallic interface. The system also includes a source configured to generate a spin current in the first magnetic layer to facilitate magnetization switching via a magnonic spin transfer torque in the second magnetic layer.

In a further embodiment, spintronic device is described. The spintronic device is within a nanowire and includes a first magnetic domain and a second magnetic domain, separated by a magnetic domain wall. The first magnetic domain wall has a first magnetization direction, and the second magnetic domain has a second magnetization direction. The nanowire has an easy axis parallel to the first magnetization direction. The magnetic domain wall is capable of propagating in the magnetic nanowire based on magnonic spin transfer torque.

In another embodiment, a method for utilizing magnonic spin transfer torque to facilitate magnetization switching is described. A spin wave is generated in a first magnetic layer of a device. The device includes a first magnetic layer with a first magnetization direction and a second magnetic layer with a second magnetization direction different from the first magnetic layer and a wall layer or interface between the first magnetic layer and the second magnetic layer. A magnonic spin transfer torque is applied to the second magnetic layer to facilitate the magnetization switching.

The following description and the drawings set forth certain illustrative aspects of the specification. These aspects are indicative, however, of but a few of the various ways in which the various embodiments of the specification may be employed. Other aspects of the specification will become apparent from the following detailed description of the specification when considered in conjunction with the drawings.

BRIEF DESCRIPTION OF THE DRAWINGS

Numerous aspects and embodiments are set forth in the following detailed description, taken in conjunction with the accompanying drawings, in which like reference characters refer to like parts throughout, and in which.

DETAILED DESCRIPTION

Figure 1:
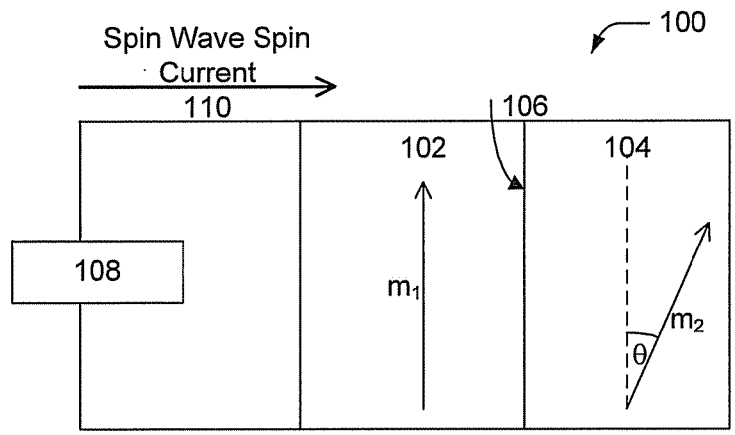
FIG. 1 is an example non-limiting schematic diagram of an example system employing a spin valve, according to an embodiment.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that the certain aspects of disclosure may be practiced without these specific details, or with other methods, components, molecules, etc. In other instances, well-known structures and devices are shown in block diagram form to facilitate description and illustration of the various embodiments.

In accordance with one or more embodiments described in this disclosure, systems and methods are described that facilitate magnetization switching driven by magnonic spin transfer torque. Magnetization switching by magnonic spin transfer torque does not require the high magnitude magnetic field required by magnetic field driven applications, nor does magnetization switching by magnonic spin transfer torque suffer from the Joule heating due to the excessive high critical current density of electric current spin transfer torque applications.

Magnons are quanta of spin waves. Like electrons, magnons carry spins. A magnon is a spin-1 object with an angular momentum of $\hbar$, (the reduced Plank constant, which is defined $h/2\pi$ and equals $1.05 \times 10^{-34}$ Js). Similar to the spin transfer torque from electrons to magnetization, a spin transfer torque from magnons to magnetization exists. However, the magnonic spin transfer torque does not suffer from excessive Joule heating like the electric current spin transfer torque.

Figure 2:
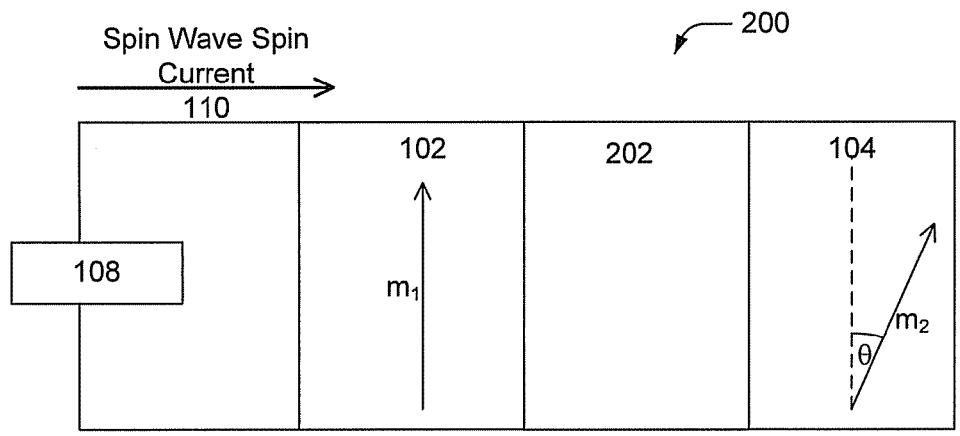
FIG. 2 is an example non-limiting schematic diagram of another example system employing a spin valve, according to an embodiment.
Figure 3:
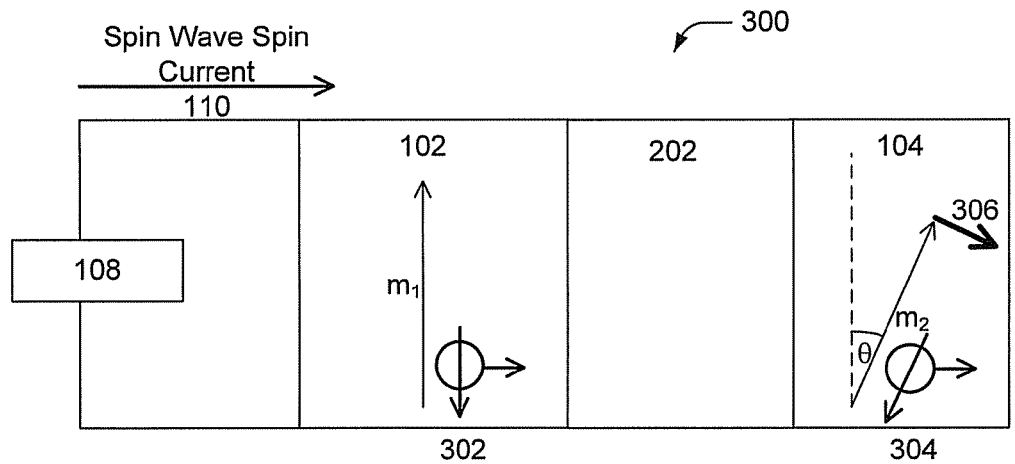
FIG. 3 is an example non-limiting schematic diagram of a system that utilizes magnonic spin transfer and the spin waves torque generated in a spin valve to facilitate magnetization switching, according to an embodiment.
Figure 4:
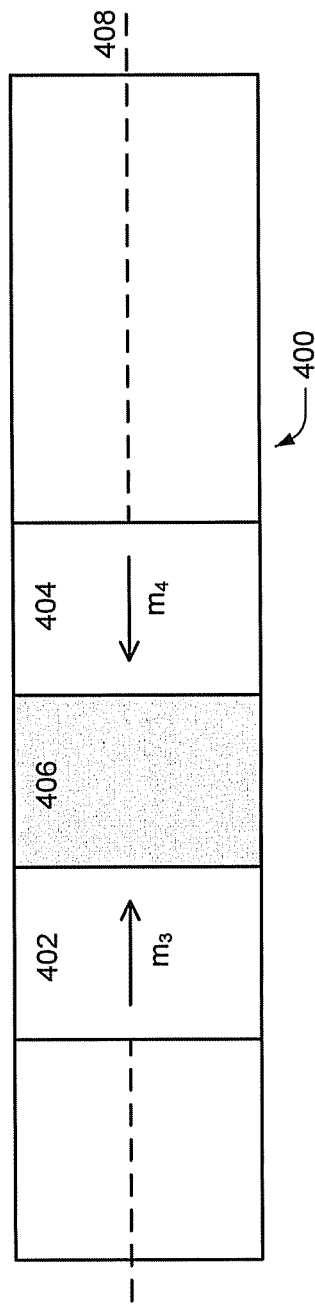
FIG. 4 is an example non-limiting schematic diagram of an example nanowire with an embedded spintronic device, according to an embodiment.
Figure 5:
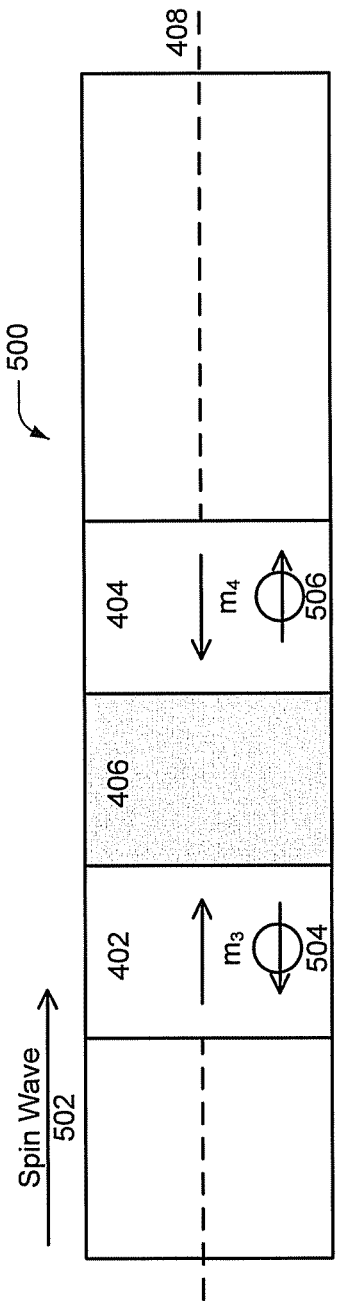
FIG. 5 is an example non-limiting schematic diagram of an example nanowire with an embedded spintronic device that utilizes magnonic spin transfer torque and the spin waves generated in the spintronic device to facilitate movement of a domain wall, according to an embodiment.
Figure 6:
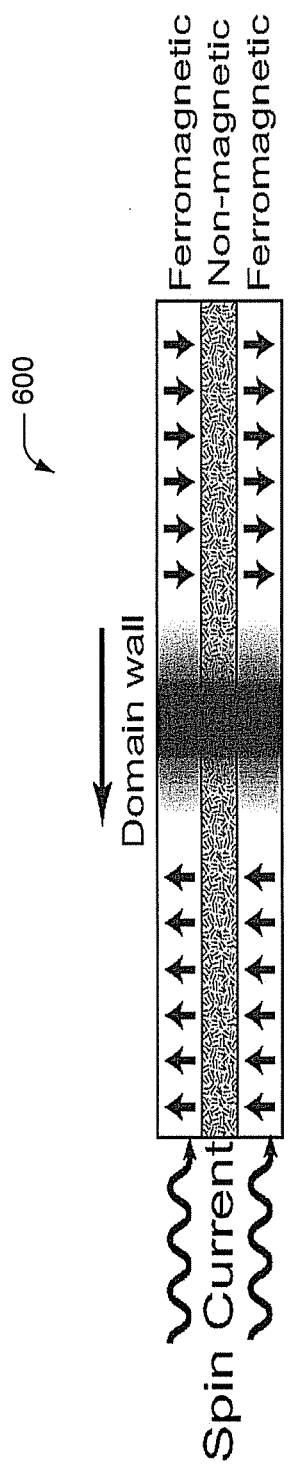
FIG. 6 is an example non-limiting schematic diagram of an example nanowire with an embedded spintronic device, according to an embodiment.

Described herein are systems and methods that can utilize magnonic spin transfer torque to drive magnetization switching in example applications, including a multilayer spin valve and magnetic domain wall propagation in magnetic nanowires. FIGS. 1-3 show a multilayer spin valve that can achieve magnetization switching through magnonic spin transfer torque. FIGS. 4-6 illustrate magnetic domain wall propagation in a magnetic nanowire through magnonic spin transfer torque.

It is noted from the following description that the systems and methods described herein allow the magnetization switching in a spin valve and magnetic domain wall propagation in magnetic nanowires driven by magnonic spin transfer torque. Systems and methods based on magnetization switching driven by magnonic spin transfer torque can be used to overcome Joule heating of spintronic devices mainly making use of electric current. Magnetization switching driven by magnonic spin transfer torque can also be used to make high speed and energy saving spintronic devices made of materials other than metals, such as magnetic semiconductors and/or magnetic insulators.

It is also noted that further applications of the magnonic spin transfer torque can exist. The multilayer spin valve and the domain wall propagation in a magnetic nanowire are illustrated herein for exemplary purposes illustrating the magnonic spin transfer torque.

Referring now to the drawings, with reference initially to FIG. 1, illustrated is an example non-limiting schematic diagram of an example system 100 employing a spin valve, according to an embodiment. The spin valve of system 100 operates based on the spins carried by magnons and resulting magnonic spin transfer torque. In other words, the spin valve of system 100 facilitates magnetization switching of macrospin through magnonic spin transfer torque.

The system 100 includes a first magnetic layer 102 in a first magnetic state $m_1$. The system 100 also includes a second magnetic layer 104 in a second magnetic state $m_2$. The second magnetic layer 104 is separated from the first magnetic layer 102 by a metallic interface 106. The system also includes a source 108 that can generate a spin current 110 in the first magnetic layer 102 to facilitate magnetization switching via a magnonic spin transfer torque in the second magnetic layer 104.

In an embodiment, the first magnetic layer 102 and the second magnetic layer 104 are each ferromagnetic layers. For example, the first magnetic layer 102 and the second magnetic layer 104 can be made of different ferromagnetic materials, each with different coercivity. Coercivity is the intensity of the applied magnetic field required to reduce the magnetization of a material to zero after the magnetization has been driven to saturation (or resistance to becoming demagnetized).

In another embodiment, the first magnetic layer 102 and/or the second magnetic layer 104 can be made of any material possessing ferromagnetic properties. The material can include a magnetic metal material, but need not include the metal material. The material can include other materials, such as a magnetic semiconductor material and/or a magnetic insulator material.

The spin current 110, in an embodiment, is a spin wave. A spin wave is a propagating disturbance in the ordering of a magnetic material. A quantization of the spin current 110 is a magnon. A magnon is a boson mode of the spin lattice that corresponds roughly to the phonon excitations of the nuclear lattice.

The source 108 can excite the spin wave in the first magnetic layer 102 by utilizing an oscillating magnetic field applied perpendicularly to the direction of magnetization $m_1$ of the first magnetic layer 102 to facilitate generation of the spin current 110 in the first magnetic layer 102, the second magnetic layer 104, and/or at the interface 106. The source 108 can, additionally or alternatively, utilize a temperature gradient across system 100 to generate the spin current 110 in the first magnetic layer 102, the second magnetic layer 104, and/or at the interface 106. The source 108 can also utilize an electric current to generate a spin current 110 in the first magnetic layer 102, in the second magnetic layer 104, and/or at the metallic interface 106. The spin current 110 can facilitate magnetization switching by magnonic spin transfer torque.

The interface 106 need not be a metallic interface. The magnetic layers 102, 104 can be separated by a non-magnetic layer 202. Referring now to FIG. 2, illustrated is an example non-limiting schematic diagram of another example system 200 employing an alternate design of a spin valve, according to an embodiment.

The spin valve of system 200 is a layered structure of a nonmagnetic spacer layer 202 sandwiched by a first magnetic layer 102 and a second magnetic layer 104. In other words, a non-magnetic layer 202 is disposed between the first magnetic layer 102 and the second magnetic layer 104 and in contact with the first magnetic layer 102 and the second magnetic layer 104.

The first magnetic layer 102 and the second magnetic layer 104 are made of magnetic materials. For example, the first magnetic layer 102 and the second magnetic layer 104 can be made of different magnetic materials, in an embodiment. Unlike previous spin valves, where the magnetic materials are required to be metals, the first magnetic layer 102 and/or the second magnetic layer 104 can be made of magnetic metals, magnetic semiconductors, and/or magnetic insulators (or any magnetic material, regardless of if the material is a metal). The non-magnetic layer 202 can include a non-magnetic metal material and/or a non-magnetic insulator material.

System 200 also includes a generator that can generate a spin current 110 or spin wave. In an embodiment, a spin wave is generated in the first magnetic layer 102. The spin wave can be achieved by using an oscillating magnetic field and/or a temperature gradient across the spin valve structure of system 200.

System 200 utilizes magnonic spin transfer torque to facilitate magnetization switching. Magnonic spin transfer torque does exist and can be utilized by system 200 to facilitate magnetization switching.

Theoretically, both electrons and magnons, quanta of spin waves, carry spins. A magnon is a spin-1 object with angular momentum of $\hbar$ (the reduced Plank constant, which is defined $h/2\pi$ and equals $1.05 \times 10^{-34}$ Js). Therefore, in theory, since electrons produce spin transfer torque that facilitates transition from electrons to magnetization, magnons should similarly experience a spin transfer torque from magnon to magnetization.

In terms of magnonic spin transfer torque, the question is how one can facilitate a spin exchange (spin transfer torque) between magnons and magnetization. As shown in FIG. 3, which is an example non-limiting schematic diagram of a system 300 that utilizes magnonic spin transfer torque generated in a spin valve to facilitate magnetization switching, according to an embodiment, the magnon excited on the first magnetic layer 102 carries a spin 302 opposite to $m_1$. When the magnon encounters the second magnetic layer 104, only the component of the magnon with spin opposite to $m_2$ 304 can pass through the spin valve structure. Therefore, there will be a torque applied on the magnon.

According to the action-reaction law (every action has an equal and opposite reaction, Newton's Third Law), there will be a reaction torque applied on the magnetization of the free layer (in this example, the second magnetic layer 104). The torque is called magnonic spin transfer torque, resulting from the propagating magnons to magnetization. The direction of the magnonic spin transfer torque 306 in the second magnetic layer 104 is illustrated in FIG. 3.

In addition to spin valve devices, magnonic spin transfer torque can also be utilized to facilitate domain wall propagation. FIG. 4 is an example non-limiting schematic diagram of an example nanowire 400 with an embedded spintronic device, according to an embodiment. The nanowire 400 has a spintronic device embedded within the nanowire 400. The spintronic device includes a first magnetic domain 402 with a first magnetization direction $m_3$. The spintronic device also includes a second magnetic domain 404 with a second magnetization direction $m_4$ opposite from the first magnetization direction $m_3$. Also included in the spintronic device is a magnetic domain wall 406 between the first magnetic layer 402 and the second magnetic layer 404. The nanowire 400 has an axis of symmetry 408 parallel to the first magnetization direction $m_3$.

In an embodiment, the spintronic device can include a first magnetic domain in a first magnetic state and a second magnetic domain in a second magnetic state separated from the first magnetic layer by a domain wall. As shown in FIG. 5, a spin wave 502 can be applied to the spintronic device to facilitate magnonic spin transfer torque.

The spin wave 502 can be generated in the magnetic nanowire 500 to facilitate magnetization reversal via magnonic spin transfer torque. The magnetic domain wall 406 propagates in a direction opposite to the direction of the spin wave 502. The spin wave can be generated in the first magnetic domain or in the second magnetic domain by application of a locally oscillating magnetic field perpendicularly to an axis of the magnetic nanowire. The spin wave 502 also can be generated in the first magnetic domain or in the second magnetic domain by establishment of a temperature gradient of the magnetic wire, by an electric current, or any other way to facilitate generation of a spin wave 502.

The nanowire 500 represents a new type of spintronic device that does not rely on electron transport to facilitate domain wall propagation, but instead relies on magnonic transfer torque to facilitate domain wall propagation. One working principle of magnonic spin transfer torque driven domain wall propagation is that the spin wave inside of the domain wall 406 satisfies a Schrodinger equation with a reflectionless potential well. The magnon spin 504 of the first magnetic domain 402 is opposite to the first magnetization direction $m_3$. The magnon spin 506 of the second magnetic domain 404 is opposite to the second magnetization direction $m_4$.

A magnon changes its spin by $2\hbar$ (the magnon spin flips from $-\hbar$ to $+\hbar$) after passing through the domain wall 406. The angular momentum is absorbed by the domain wall 406, resulting in propagation of the domain wall in the opposite direction to that of the spin wave propagation.

Referring now to FIG. 6, illustrated is an example non-limiting schematic diagram 600 of an example nanowire with an embedded spintronic device, according to an embodiment. The nanowire has a ferromagnetic and non-magnetic multi-layer structure, and utilizes magnonic spin transfer torque generated in the spintronic device to facilitate movement of a domain wall.

Figure 7:
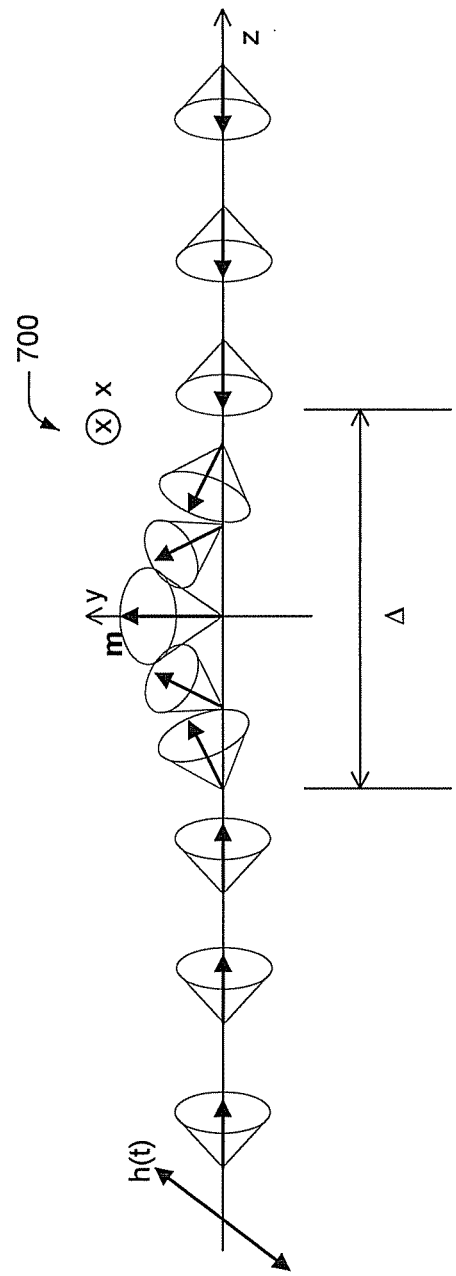
FIG. 7 is an example non-limiting schematic diagram of spin wave propagation through a transverse domain wall structure, according to an embodiment.

Referring now to FIG. 7, illustrated is an example non-limiting schematic diagram 700 of spin wave propagation through a transverse domain wall structure, according to an embodiment. A magnetic domain wall is a solitonic object that connects regions of a magnet in which the magnetization has a stable configuration.

The spin wave or magnon is a small amplitude precession of m (represented by cones around arrow projections in FIG. 7) around the static domain wall. A linearly polarized microwave h(t) is applied in a small region on the left side of the domain wall so that the generated spin wave propagates through the domain wall from the left. A represents the width of the domain wall.

Figure 8:
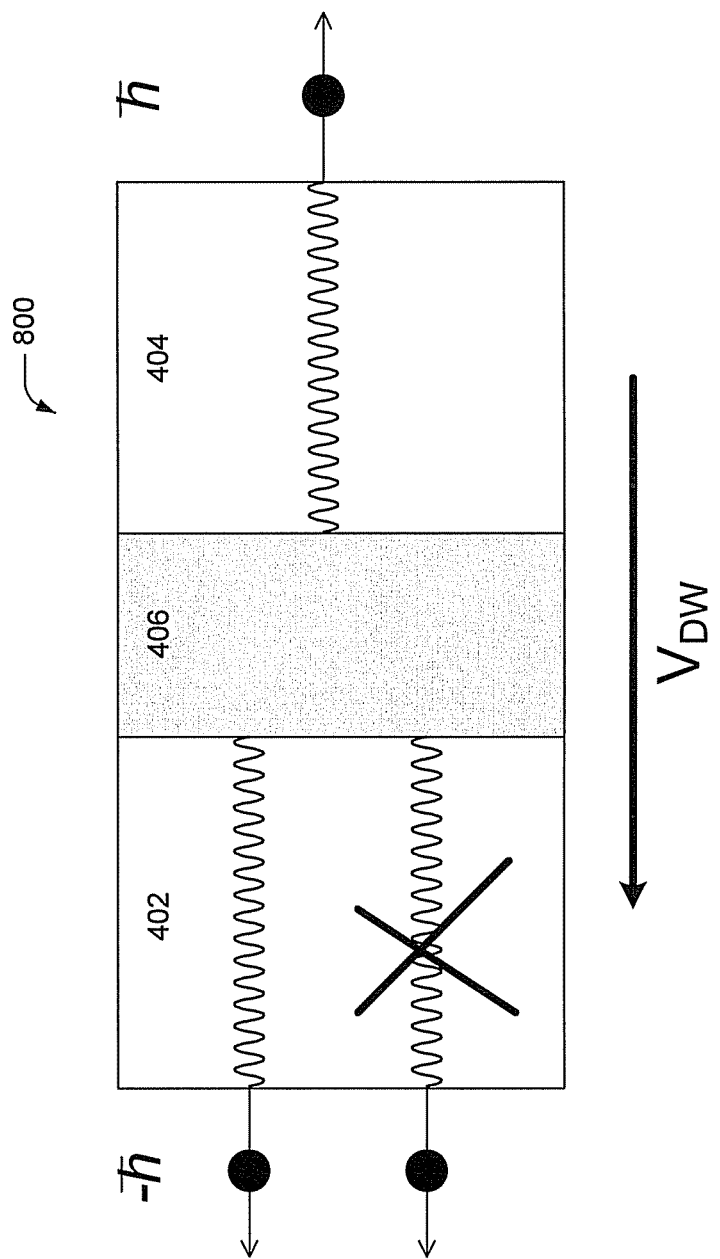
FIG. 8 is an example non-limiting schematic diagram of a magnon passing through a domain wall without reflection, according to an embodiment.

The spin wave propagates through the domain wall from left to right, resulting in an opposite domain wall propagation direction. FIG. 8 is an example non-limiting schematic diagram 800 of a magnon passing through a domain wall without reflection, according to an embodiment. The magnon pass through the domain wall 406 from left 402 to right 404 without reflection (X indicating the reflection that does not occur). The path of the magnon is represented by wavy lines with arrows indicating the propagating directions. The magnon spin is −ℏ on the left side of the domain wall 406 and ℏ on the right side of the domain wall 406. The magnonic spin transfer torque drives the domain wall 406 propagating to the opposite direction of the spin wave (right to left) with velocity $V_{DW}$.

The validity of these findings can be verified by solving the Landau-Lifshitz-Gilbert (LLG) equation numerically in a one-dimensional nanowire with material parameters of a ferrimagnet yttrium iron garnet (YIG). It is observed that a spin wave reserves its spin direction after passing through the domain wall. At the same time, the domain wall moves opposite to the spin wave propagation direction.

Consider a head-to-head domain wall in a magnetic nanowire whose easy axis is defined as the z-axis along the wire as shown in FIG. 6. The magnetization dynamics can be described by the LLG equation, $$\frac{\partial m}{\partial t} = -m \times h_{eff} + \alpha m \times \frac{\partial m}{\partial t}, \quad (1)$$

where m is the unit direction of local magnetization $M = m M_s$ with a saturation magnetization $M_s$, $\alpha$ is the phenomenological Gilbert damping constant, and $h_{eff}$ is the effective magnetic field consisting of anisotropy and exchange fields in the unit of $M_s$. t is normalized by $(\gamma M_s)^{-1}$ and $\gamma$ is the gyromagnetic ratio. For the simplicity, a uniaxial wire is considered with $$h_{eff} = K m_z \hat{z} + A \frac{\partial^2 m}{\partial z^2}$$

where $m_z$ is the z-component of m, K and A are the anisotropy and exchange coefficients, respectively. In the spherical coordinates of polar angle θ and azimuthal angle θ, m=(sin θ cos φ, sin θ sin φ, cos θ). For a static domain wall, $m = m_0$ is given by the Walker profile $$\tan\frac{\theta_0}{2} = \exp\left(\frac{z}{\Delta}\right)$$

and lies in a fixed plane, say y-z plane $$\left(\phi_0 = \frac{\pi}{2}\right),$$

where $\Delta = \sqrt{A/K}$ is the domain wall width.

To derive the equation of motion for spin wave, a small fluctuation of m around $m_0$ is expressed in terms of unit directions $\hat{e}_r$, $\hat{e}_\theta$, and $\hat{e}_\phi$ defined by $m_0$, $$mB\hat{e}_r + [m_\theta(z)\hat{e}_\theta + m_\phi(z)\hat{e}_\phi]e^{-i\omega t}, \quad (2)$$

where ω is the spin wave frequency. $m_\theta$ and $m_\phi$ are small, $\sqrt{m_\theta^2 + m_\phi^2} = 1$. Substitute Equation (2) into Equation (1) and neglect the higher-order terms, such as $m_\theta^2$, $m_\theta m'_\theta$, $m_\theta m_\phi$, etc. (' denotes the derivative in z), in the absence of the damping, to obtain, $$-i\omega m_\theta = A m''_\phi + K(2\sin^2\theta_0 - 1)m_\phi, \quad (3)$$

$$i\omega m_\phi = A m''_\theta + K(2\sin^2\theta_0 - 1)m_\theta. \quad (4)$$

By defining $\phi = m_\theta - i m_\phi$, Equation (3) and Equation (4) can be recast as $$q^2 \varphi(\xi) = \left[-\frac{d^2}{d\xi^2} - 2\,\text{sech}^2 \xi\right]\varphi(\xi), \quad (5)$$

with $\xi = \frac{z}{\Delta}$, and $q^2 = \frac{\omega}{K} - 1$.

This is a Schrodinger equation with propagating waves, $$\varphi(\xi) = \rho \frac{\tanh\xi - iq}{-iq - 1} e^{iq\xi}, \quad (6)$$

where ρ is the spin wave amplitude. Equation (6) describes propagating spin waves without reflection, and takes an asymptotic form of $$\varphi(\xi \to -\infty) = \rho e^{iq\xi} \text{ and } \varphi(\xi \to +\infty) = -\rho \frac{1 - iq}{1 + iq} e^{iq\xi}.$$

The spin wave maintains its amplitude and only captures an extra phase after passing through the domain wall. The above result is very robust, and holds even with the extra Dzyaloshinskii-Moriya interaction $$Dm \cdot \left(\hat{z} \times \frac{\partial m}{\partial z}\right)$$

in Equation (1).

One consequence of the above results is schematically illustrated in FIG. 8: The magnons whose spins point to the left (opposite to the magnetization of the left domain) are injected into the domain wall from the left. The magnons transmit completely through the domain wall with their spins reversed (to the right). The change of magnons spins should be transferred to the domain wall, an all-magnonic spin transfer torque. Thus, the domain wall propagates to the left, opposite to the magnon propagation.

This result can also be understood directly from Equation (1). In the absence of damping, Equation (1) can be cast as $$\frac{\partial m}{\partial t} = -m \times K m_z \hat{z} - \frac{\partial}{\partial z} J, \quad (7)$$

where $J = Am \times \frac{\partial m}{\partial z}$ is the magnetization current, also called spin wave spin current. The z-component of Eq. (7) is conserved so that $\partial_t m + \partial_z J_z = 0$, where $J_z$ is the z-component of J. In terms of φ, $$J_z = \frac{A}{2i\Delta}(\varphi \partial_\xi \varphi^* - \varphi^* \partial_\xi \varphi)\cos\theta_0$$

in the two domains. For the propagating spin wave (6), $J_z = -A\rho^2 k$ in the far left of the wire ($z \to -\infty$ and $\theta_0 = 0$), while $J_z = A\rho^2 k$ in the far right ($z \to \infty$ and $\theta_0 = \pi$), where $k = q/\Delta$ is the spin wave vector in real space. The spin current changes its sign after passing through the domain wall, and results in an all-magnonic spin transfer torque on the domain wall. Thus, in order to absorb this torque, domain wall must propagate to the left with the velocity $$v_{DW} = -\frac{\rho^2}{2} V_g \hat{z},$$

where $V_g = \partial \omega / \partial k = 2Ak$ is the group velocity.

Equation (1) is solved numerically in a one-dimensional magnetic nanowire to test the validity of these findings in the realistic situation when both damping and transverse anisotropy are present.

In the simulations, the time, length, and field amplitude are in the units of $(\gamma M_s)^{-1}$, $\sqrt{A/M_s}$, and $M_s$, respectively, so that velocity is in the unit of $\gamma \sqrt{AM_s}$. In terms of YIG parameters: $M_s = 0.194 \times 10^6$ A/m, $K = 0.388 \times 10^5$ A/m, and $A = 0.328 \times 10^{-10}$ Am, these units are $1.46 \times 10^{-10}$ s, 13 nm, and 89 m/s. The wire length is chosen to be 1000 (from $z = -500$ to $z = 500$) with open boundary conditions and a transverse domain wall is initially placed at the center of the wire.

A spin wave of frequency $\omega$ is generated by applying an external sinusoidal magnetic field $h(t) = h_0 \sin(\omega t)\hat{x}$ of frequency $\Omega$ and amplitude $h_0$ locally in the region of $[-60, -55]$ in the left side of the wire. Thus, spin wave propagates from the left to the right as illustrated in FIG. 8.

Equation (1) is solved numerically by using the standard method of lines. The space is divided into small meshes 0.05 and an adaptive time-step control is used for the time evolution of the magnetization. In terms of YIG parameters, the geometry of the nanowire is 0.65 nm×0.65 nm in cross section and 13 μm in length. The domain wall will move under the influence of the spin wave. The spatial-temporal dependence of $m_z$ is used to locate the domain wall center which, in turn, is used to extract the domain wall velocity.

Figure 9:
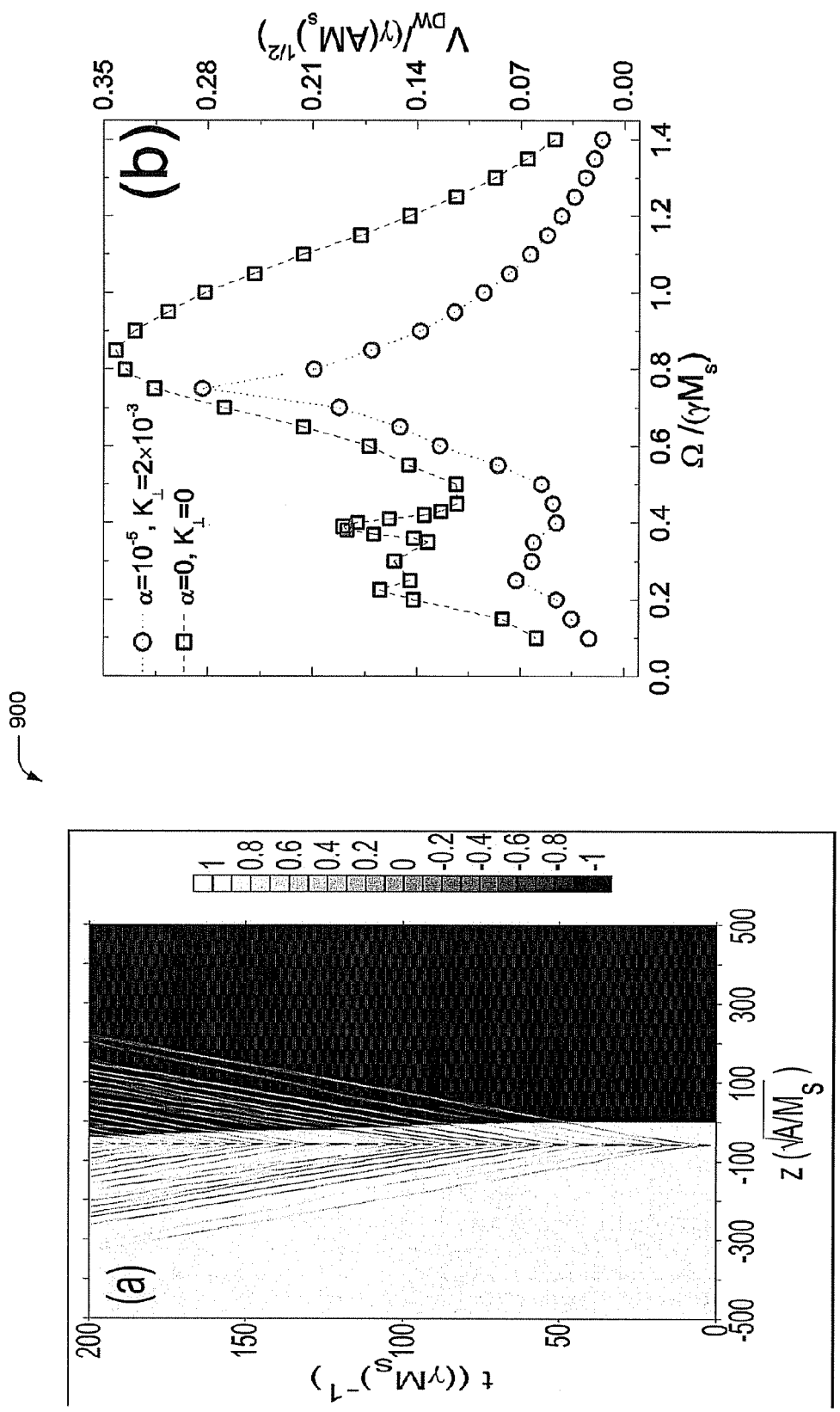
FIG. 9 illustrates example non-limiting graphs showing features of the domain wall when exposed to a spin wave, according to an embodiment.

Referring now to FIG. 9, illustrated are example non-limiting graphs showing features of the domain wall when exposed to the spin wave simulation, according to an embodiment. FIG. 9a is the density plot of $m_z$ in the z-t plane at frequency $\Omega = 0.75$ for $\alpha = 10^{-5}$ and $K_\perp = 2 \times 10^{-3}$ (YIG parameters), and $h_0 = 1$. The center of domain wall is initially at $z = 0$. The spin wave is generated in the region of z in $[-60, -55]$. FIG. 9b illustrates the frequency dependence of domain wall velocity. The circles are for YIG parameters, and the squares are the results of the case without damping and transverse magnetic anisotropy. The errors bars are smaller than the symbols.

The complicated and irregular frequency dependence of domain wall velocity at the low frequency is likely related to the observation of the polychromatic spin wave generation. At a large enough frequency ($\Omega > 0.55$), the excited spin wave is almost monochromatic with the same frequency as the oscillating field. These curves show that the domain wall propagation velocity is very sensitive to the microwave frequency. In fact, there exists an optimal frequency at which the domain wall velocity is maximal for a given set of parameters.

For the cases shown in the FIG. 9, the optimal frequencies are $\Omega = 0.75$ in the presence of damping and transverse magnetic anisotropy and a higher optimal frequency $\Omega = 0.85$ without them.

Figure 10:
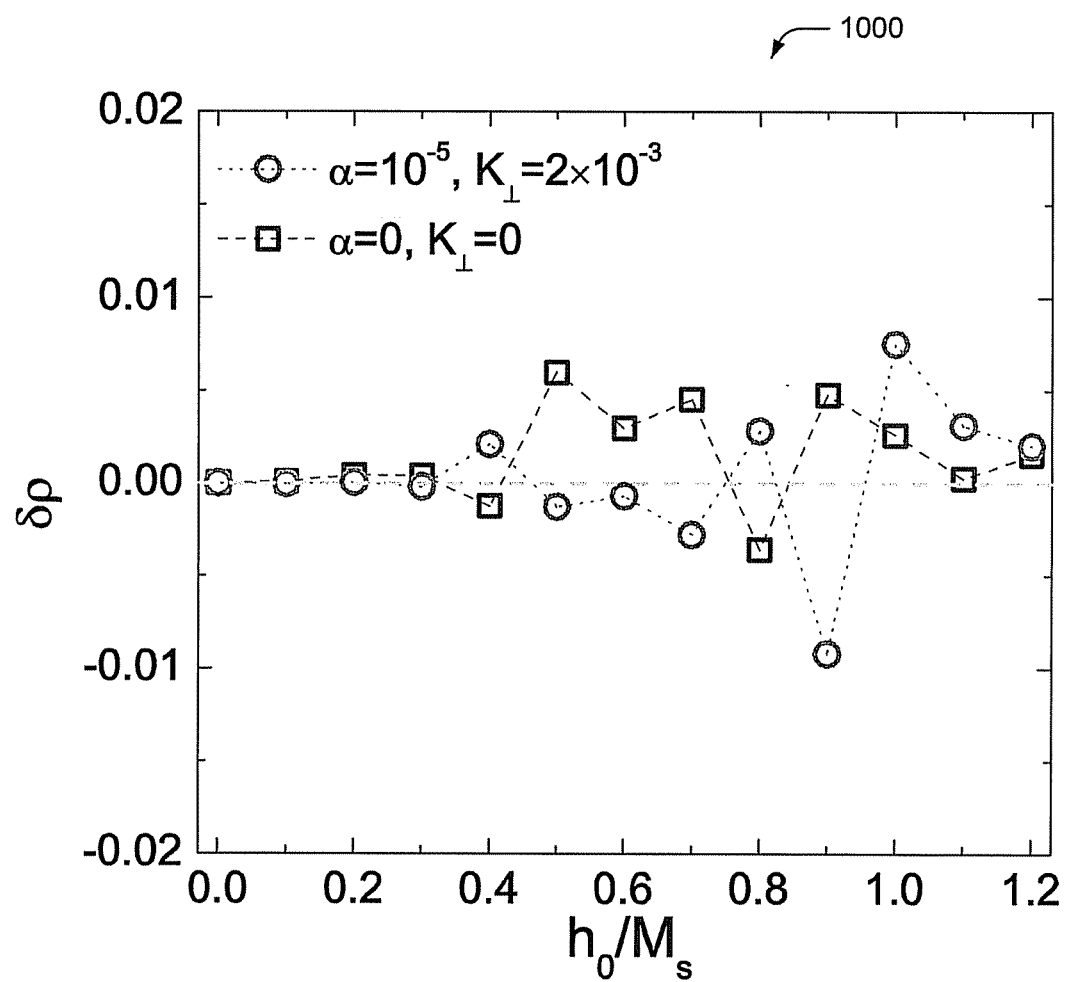
FIG. 10 is an example non-limiting graph illustrating field dependence of spin wave amplitude differences at two sites located at opposite sides of the domain wall, according to an embodiment.

Referring now to FIG. 10, illustrated is an example non-limiting graph showing field dependence of spin wave amplitude differences at two sites located at opposite sides of the domain wall, according to an embodiment. Circles represent the YIG parameters at the optimal frequency ($\Omega = 0.75$), and squares are the results without damping and the transverse magnetic anisotropy also at its optimal frequency ($\Omega = 0.85$).

The reflectionless property (total transmission) of the spin wave through the domain wall can also be verified through quantitative analysis of spin wave amplitude on the two opposite sides of the domain wall. If the spin wave is monochromatic (a sinusoidal wave) and passes through the domain wall without reflection, the difference of the spin wave amplitudes on the two sides of the domain wall is around zero. We evaluate the spin wave amplitude difference at $z = -160$ and $z = 45$ at the same time, denoted as $\delta\rho$. FIG. 10 shows the numerical results of $\delta\rho$ as a function of microwave field $h_0$.

As expected, $\delta\rho$ is almost zero (dashed line) both with (circles) and without (squares) damping and magnetic anisotropy. For non-monochromatic (sum of many sinusoidal waves) spin waves, the amplitudes on the two sides of the domain wall may be different at any particular time due to the complicated interference of waves with different frequencies. This is the case for large $h_0$, as shown by the oscillatory $\delta\rho$ around zero. The total transmission of spin waves through a domain wall is an important property because it results in a larger spin wave spin current, and generates a larger magnonic spin transfer torque.

Figure 11:
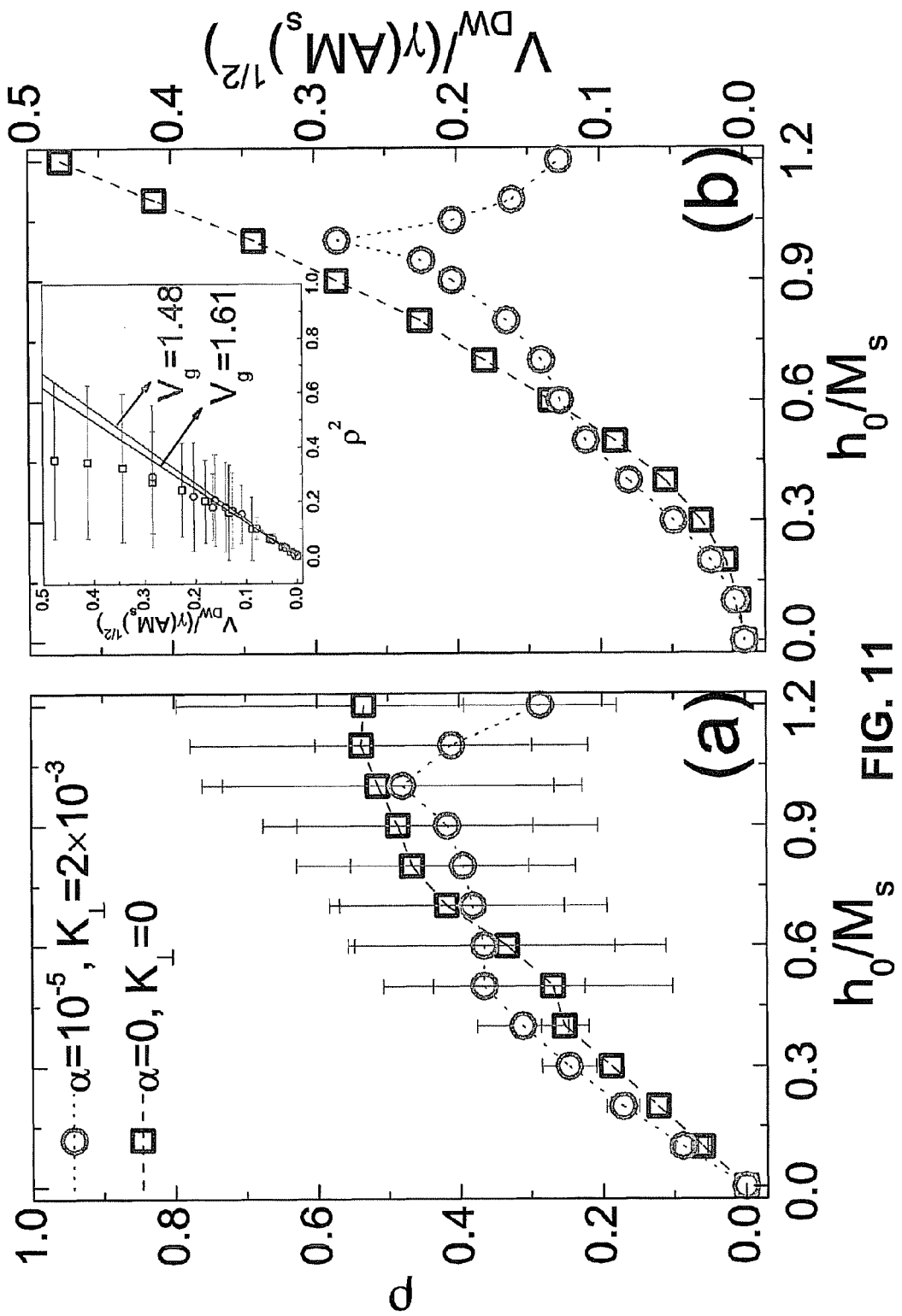
FIG. 11 shows example non-limiting graphs illustrating the field dependence of features of the domain wall when exposed to a spin wave, according to an embodiment.

FIG. 11 shows example non-limiting graphs illustrating the field dependence of features of the domain wall when exposed to a spin wave, according to an embodiment. FIG. 11a is the field dependence of spin wave amplitude for YIG parameters (red circles) at frequency $\Omega = 0.75$ and the case without damping and transverse magnetic anisotropy (blue squares) at frequency $\Omega = 0.85$. FIG. 10b is the field dependence of DW velocity for the same cases as those in FIG. 11a. Inset: Domain wall velocity versus the square of spin wave amplitude. Symbols are the simulation data, and solid lines are $$\frac{\rho^2}{2} V_g$$

without any fitting parameters.

FIG. 11a shows the $h_0$-dependence of the spin wave amplitude $\rho$. It is almost linear at low fields both with (circles) and without (squares) damping and transverse magnetic anisotropy. The behavior is complicated at high fields, and a large error bar of $\rho$ is observed, accompanying less regular and polychromatic spin wave generation.

This behavior also results in a large fluctuation of $\rho$. The $h_0$-dependence of the domain wall velocity $V_{DW}$ is shown in FIG. 11b. It is non-monotonic for the realistic situation with YIG parameters (circles) and almost quadratic for the case without damping and transverse magnetic anisotropy (squares). Although the field dependence of domain wall velocity is non-monotonic, the relationship between the domain wall velocity and the spin wave amplitude is much simpler.

As shown in the inset of FIG. 11b, the domain wall velocity $V_{DW}$ is almost quadratic in ρ both with (circles) and without (squares) damping and transverse magnetic anisotropy. Solid lines show $$\frac{\rho^2}{2}V_g$$

without any fitting parameter, where $V_g$=1.48 at Ω=0.75 for the YIG case and $V_g$=1.61 at Q=0.85 in the absence of damping and transverse anisotropy, and ρ is calculated numerically.

Although there is no reason why the early velocity formula derived under the approximation of zero damping for uniaxial wire and small spin wave amplitude should be applicable to the realistic case when both damping and transverse magnetic anisotropy are presented, the theoretical formula is, in fact, not too far from the numerical data for both cases. It should not be surprising for the deviation at large ρ since quadratic ρ dependence of $V_{DW}$ is derived based on the conservation of z-component of angular momentum that does not hold for the generic cases.

Most studies of magnonic effects in nanomagnetism have studied the conversion of magnon spins with electron spins. Often, these studies focus on the Seebeck effect that involves both thermal and electronic transport. Thus, like usual electronic spin transfer torque, devices based on the Seebeck effect must contain also metallic parts that suffer from the disadvantages of Joule heating. In contrast, the magnonic spin transfer torque does not require electron transport. Devices based on all-magnonic spin transfer torque can be made of magnetic insulators like YIG (or magnetic semiconductors) so that the Joule heating is, in principle, avoided.

All-magnonic spin transfer torque also exhibit advantages over its electronic counterpart on energy consumption as well as on the spin transfer efficiency. It also enables the use of magnetic insulators in spintronic devices.

Figure 12:
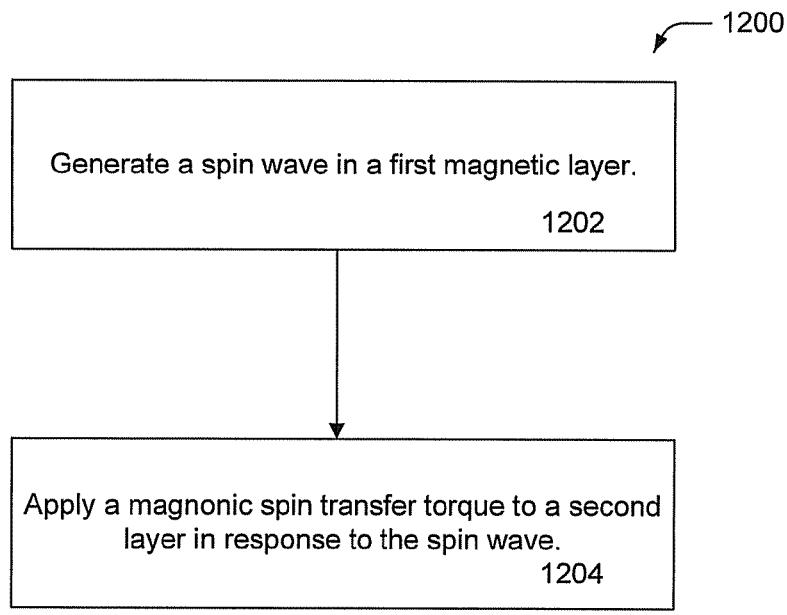
FIG. 12 is an example non-limiting process flow diagram of a method for using magnonic spin transfer torque to switch magnetization in a spintronic device, according to an embodiment.
Figure 13:
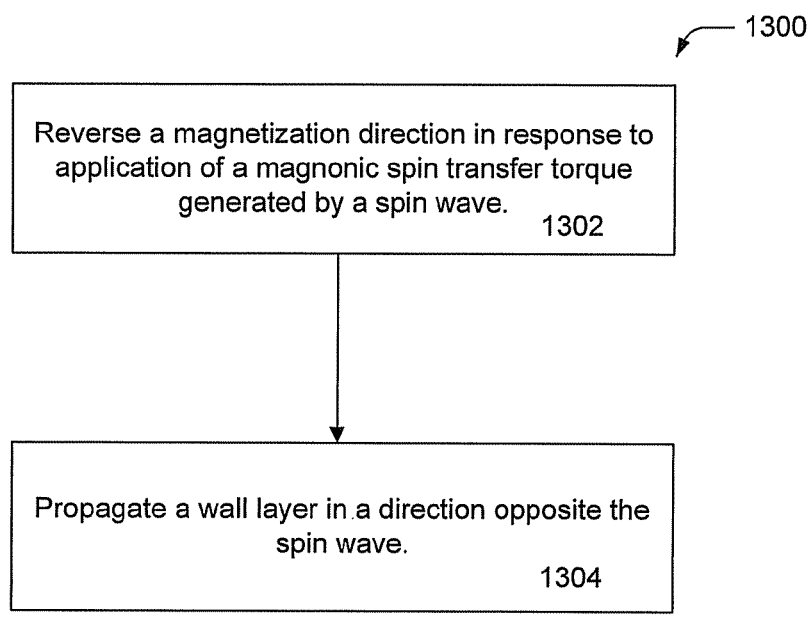
FIG. 13 is an example non-limiting process flow diagram of a method for using magnonic spin transfer torque to facilitate propagation of a domain wall in a spintronic device, according to an embodiment.

FIGS. 12 and 13 illustrate methods and/or flow diagrams in accordance with embodiments of this disclosure. For simplicity of explanation, the methods are depicted and described as a series of acts. However, acts in accordance with this disclosure can occur in various orders and/or concurrently, and with other acts not presented and described in this disclosure. Furthermore, not all illustrated acts may be required to implement the methods in accordance with the disclosed subject matter. In addition, those skilled in the art will understand and appreciate that the methods could alternatively be represented as a series of interrelated states via a state diagram or events.

FIG. 12 is an example non-limiting process flow diagram of a method 1200 for using magnonic spin transfer torque to switch magnetization in a spintronic device, according to an embodiment. At 1202, a spin wave is generated in a first magnetic layer. The first magnetic layer is in a spin transfer device comprising a first magnetic layer with a first magnetization direction, a second magnetic layer with a second magnetization direction different from the first magnetization direction, and a wall layer or interface between the first magnetic layer and the second magnetic layer. The spin wave can be generated, for example, by applying a local oscillating magnetic field to the device and/or applying a temperature gradient to the device. At 1204, a magnonic spin transfer torque is applied to the second magnetic layer. Application of the magnonic spin transfer torque facilitates magnetization switching in the second magnetic layer.

FIG. 13 is an example non-limiting process flow diagram of a method 1300 for using magnonic spin transfer torque to facilitate propagation of a domain wall in a spintronic device, according to an embodiment. At element 1302, a magnetization direction is reversed (e.g., in a second magnetic domain of a spin transfer device) in response to application of a magnonic spin transfer torque generated by a spin wave. At 1304, a wall layer is propagated in a direction opposite to the spin wave.

What has been described above includes examples of the embodiments of the subject disclosure. It is, of course, not possible to describe every conceivable combination of components or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in this disclosure for illustrative purposes, various modifications are possible that are considered within the scope of such embodiments and examples, as those skilled in the relevant art can recognize.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements. \Numerical data, such as temperatures, concentrations, times, ratios, and the like, are presented herein in a range format. The range format is used merely for convenience and brevity. The range format is meant to be interpreted flexibly to include not only the numerical values explicitly recited as the limits of the range, but also to include all the individual numerical values or sub-ranges encompassed within the range as if each numerical value and sub-range is explicitly recited. When reported herein, any numerical values are meant to implicitly include the term "about." Values resulting from experimental error that can occur when taking measurements are meant to be included in the numerical values.

What is claimed is:

1. A spintronic device, comprising:
   a first magnetic domain with a first magnetization direction;

a second magnetic domain with a second magnetization direction opposite from the first magnetization direction; and a magnetic domain wall between the first magnetic domain and the second magnetic domain, wherein the spintronic device is within a magnetic nanowire with an easy axis parallel to the first magnetization direction.

2. The spintronic device of claim 1, wherein a spin wave is generated in the magnetic nanowire to facilitate magnetization switching via a magnonic spin transfer torque.

3. The spintronic device of claim 2, wherein the spin wave is generated in the first magnetic domain or in the second magnetic domain by application of a locally oscillating magnetic field.

4. The spintronic device of claim 2, wherein the spin wave is generated in the first magnetic domain or in the second magnetic domain by establishment of a temperature gradient of the magnetic wire or by an electric current.

5. The spintronic device of claim 2, wherein the magnetic domain wall propagates in a direction opposite to that of the spin wave.

6. The spintronic device of claim 1, wherein a magnon spin of the first magnetic domain is opposite to the first magnetization direction or a magnon spin of the second magnetic domain is opposite to the second magnetization direction.

7. A method, comprising:

generating a spin wave in a first magnetic layer of a device comprising a first magnetic layer with a first magnetization direction, and applying a magnonic spin transfer torque to the second magnetic layer with a second magnetization direction different from the first magnetization direction.

8. The method of claim 7, wherein the generating further comprises applying a local oscillating magnetic field to the device.

9. The method of claim 7, wherein the generating further comprises applying a temperature gradient to the device.

10. The method of claim 7, wherein the generating further comprises applying an electric current to the device.

11. The method of claim 7, further comprising reversing the second magnetization direction.

12. The method of claim 7, further comprising propagating the wall layer in a direction opposite the spin wave.

13. The method of claim 7, wherein the device further comprises a non-magnetic layer disposed between the first magnetic layer and the second magnetic layer and in contact with the first magnetic layer and the second magnetic layer.

* * * * *